United States Patent
Al-Shahri et al.

(10) Patent No.: US 11,574,083 B2
(45) Date of Patent: Feb. 7, 2023

(54) METHODS AND SYSTEMS FOR SELECTING INFLOW CONTROL DEVICE DESIGN SIMULATIONS BASED ON CASE SELECTION FACTOR DETERMINATIONS

(71) Applicant: Saudi Arabian Oil Company, Dhahran (SA)

(72) Inventors: Ali M. Al-Shahri, Doha (SA); Nauman Aqeel, Dhahran (SA); Raheel R. Baig, Dhahran (SA); Ahmed Bubshait, Dhahran (SA)

(73) Assignee: Saudi Arabian Oil Company, Dhahran (SA)

( * ) Notice: Subject to any disclaimer, the term of this patent is extended or adjusted under 35 U.S.C. 154(b) by 54 days.

(21) Appl. No.: 17/183,988

(22) Filed: Feb. 24, 2021

(65) Prior Publication Data
US 2021/0350035 A1    Nov. 11, 2021

Related U.S. Application Data

(60) Provisional application No. 63/022,894, filed on May 11, 2020.

(51) Int. Cl.
*G06G 7/48* (2006.01)
*G06F 30/10* (2020.01)

(52) U.S. Cl.
CPC .................... *G06F 30/10* (2020.01)

(58) Field of Classification Search
CPC ....... E21B 2200/20; E21B 43/12; G06F 30/10
See application file for complete search history.

(56) References Cited

U.S. PATENT DOCUMENTS

| 7,894,991 B2 | 2/2011 | Del Castillo et al. |
| 9,341,060 B2 | 5/2016 | Banian et al. |

(Continued)

FOREIGN PATENT DOCUMENTS

| CN | 103696745 B | 5/2016 |
| CN | 111079341 A | 4/2020 |
| WO | 2019081948 A1 | 5/2019 |

OTHER PUBLICATIONS

Maalouf, Christophe Bassem, et al. "Responsive design of inflow control devices completions for horizontal wells." Abu Dhabi International Petroleum Exhibition & Conference. OnePetro, 2017.*

(Continued)

*Primary Examiner* — Rehana Perveen
*Assistant Examiner* — Nithya J. Moll
(74) *Attorney, Agent, or Firm* — Dinsmore & Shohl LLP

(57) ABSTRACT

A method relates to generating and selecting in-flow control device design simulations. The method includes generating, based on a synthetic production logging profile and properties of a reservoir associated with a target well, a first design simulation and a second design simulation, the first design simulation including representations of a first plurality of in-flow devices and the second design simulation including different representations of a second plurality of in-flow devices, locations of the representations of the first plurality of in-flow devices and different locations of the different representations of the second plurality of in-flow devices is based on density parameters and cross-sectional area parameters, generating, automatically and without user intervention, case selection factors associated with each of the first design simulation and the second design simulation, ranking, automatically and without user intervention, the case selection factors; and selecting based on the ranking, auto- (Continued)

matically and without user intervention, at least one of the first design simulation or the second design simulation.

17 Claims, 8 Drawing Sheets

(56) References Cited

U.S. PATENT DOCUMENTS

| | | | |
|---|---|---|---|
| 9,341,557 | B2 | 5/2016 | Banian et al. |
| 10,208,578 | B2 | 2/2019 | Perkins et al. |
| 10,502,047 | B2 | 12/2019 | Maus et al. |
| 2014/0262235 | A1 | 9/2014 | Rashid et al. |
| 2016/0153265 | A1 | 6/2016 | Filippov et al. |
| 2020/0157887 | A1* | 5/2020 | Alonso ............. E21B 43/30 |

OTHER PUBLICATIONS

Luo, Wei, et al. "A new semi-analytical model for predicting the performance of horizontal wells completed by inflow control devices in bottom-water reservoirs." Journal of Natural Gas Science and Engineering 27 (2015): 1328-1339.*

Youngs, Bryony, Kieran Neylon, and Jonathan Anthony Holmes. "Recent advances in modeling well inflow control devices in reservoir simulation." IPTC 2009: International Petroleum Technology Conference. European Association of Geoscientists & Engineers, 2009.*

Ouyang, Liang-Biao. "Practical consideration of an inflow-control device application for reducing water production." SPE Annual Technical Conference and Exhibition. OnePetro, 2009.*

Adekunle, "Intelligent Well Application in Production Wells", Thesis, University of Aberdeen, Sep. 2012.

Chammout et al., "Downhole flow controllers in mitigating challenges of long reach horizontal wells: a practical butlook with case studies", Journal of Petroleum and Gas Engineering, vol. 8, No. 10, pp. 97-110, Dec. 2017.

International Search Report and Written Opinion dated Jun. 17, 2021 pertaining to International application No. PCT/US2021/021657 filed Mar. 10, 2021, 21 pages.

Archibong, C. et al. "Optimization Study on Inflow Control Devices for Horizontal Wells in Thin Oil Column Reservoirs: a Case Study of a Well in Niger delta", SPE-189122-MS, Society of Petroleum Engineers, Aug. 2, 2017, pp. 1-12.

Dowlatabad, M. M. "Novel Integrated Approach Simultaneously Optimising AFI Locations Plus Number and (A)ICD Sizes", SPE-174309-MS, Society of Petroleum Engineers, EUROPEC 2015, Jun. 1, 2015, pp. 1-18.

* cited by examiner

METHODS AND SYSTEMS FOR SELECTING INFLOW CONTROL DEVICE DESIGN SIMULATIONS BASED ON CASE SELECTION FACTOR DETERMINATIONS

CROSS REFERENCE

This application claims priority to U.S. Provisional Application Ser. No. 63/022,894, filed on May 11, 2020.

TECHNICAL FIELD

The present disclosure relates to systems and methods for generating in-flow control device design simulations, and more particularly, to generating and selecting one or more of these simulations based on case selection factors that are calculated based on a specific number and configuration of in-flow device placements within a plurality of compartments of a well.

BACKGROUND

Oil and gas companies implement various engineering workflows and procedures to ensure that oil production from each and every well in an oil field is robust, efficient, and plentiful. To this end, oil and gas companies use conventional tools and techniques that utilize a combination of hardware and software to generate simulations that incorporate various properties of oil wells, fields, composition of reservoirs, and so forth. However, these tools fail to generate multiple simulations of inflow control devices (ICDs) using a reservoir simulation model such that the simulations include the ICDs automatically placed in various configurations within compartments of well casings. Moreover, these tools fail to provide functionalities that enable the updating and modifying of these simulations in real time.

SUMMARY

According to the subject matter of the present disclosure, a method implemented by a computing device for generating in-flow control device design simulations and selecting at least one simulation from the generated simulations based on a case selection factor value of this simulation relative to the other simulations, is provided. The method includes generating, based on a synthetic production logging profile and properties of a reservoir associated with a target well, a first design simulation and a second design simulation, the first design simulation including representations of a first plurality of in-flow devices and the second design simulation including different representations of a second plurality of in-flow devices, locations of the representations of the first plurality of in-flow devices and different locations of the different representations of the second plurality of in-flow devices is based on density parameters and cross-sectional area parameters, generating, automatically and without user intervention, case selection factors associated with each of the first design simulation and the second design simulation, ranking, automatically and without user intervention, the case selection factors, and selecting based on the ranking, automatically and without user intervention, at least one of the first design simulation or the second design simulation.

According to the subject matter of the present disclosure, a system comprises one or more processors. The system also includes one or more non-transitory memory modules communicatively coupled to the one or more processors and storing machine-readable instructions that, when executed, cause the one or more processors to generate, based on a synthetic production logging profile and properties of a reservoir associated with a target well, a first design simulation and a second design simulation, the first design simulation including representations of a first plurality of in-flow devices and the second design simulation including different representations of a second plurality of in-flow devices, locations of the representations of the first plurality of in-flow devices and different locations of the different representations of the second plurality of in-flow devices is based on density parameters and cross-sectional area parameters, generate, automatically and without user intervention, case selection factors associated with each of the first design simulation and the second design simulation, ranking, automatically and without user intervention, the case selection factors, and select based on the ranking, automatically and without user intervention, at least one of the first design simulation or the second design simulation.

According to the subject matter of the present disclosure, another method implemented by a computing device for generating in-flow control device design simulations and selecting at least one simulation from the generated simulations based on a case selection factor value of this simulation relative to the other simulations is provided. The method includes generating a reservoir simulation model, predicting, using the reservoir simulation model, properties of a reservoir associated with a target well, the properties relating to a trajectory of the target well, and generating, using a synthetic production logging profile and the properties of the reservoir associated with the target well, representations of a plurality of compartments in the target well, the synthetic production logging profile is based on fluid flow data estimations along the trajectory of the target well. The method includes generating, based on the synthetic production logging profile and the properties of the reservoir associated with the target well, a first design simulation and a second design simulation, the first design simulation including representations of a first plurality of in-flow devices and the second design simulation including different representations of a second plurality of in-flow devices, locations of the representations of the first plurality of in-flow devices and different locations of the different representations of the second plurality of in-flow devices is based on density parameters and cross-sectional area parameters, generating, automatically and without user intervention, case selection factors associated with each of the first design simulation and the second design simulation, and ranking, automatically and without user intervention, the case selection factors. The method further includes selecting based on the ranking, automatically and without user intervention, at least one of the first design simulation or the second design simulation.

These and additional features provided by the embodiments described herein will be more fully understood in view of the following detailed description, in conjunction with the drawings. Additionally, please note that the detailed description of specific embodiments of the present disclosure can be best understood when read in conjunction with the following drawings, where like structure is indicated with like reference numerals.

DETAILED DESCRIPTION

Figure 1:
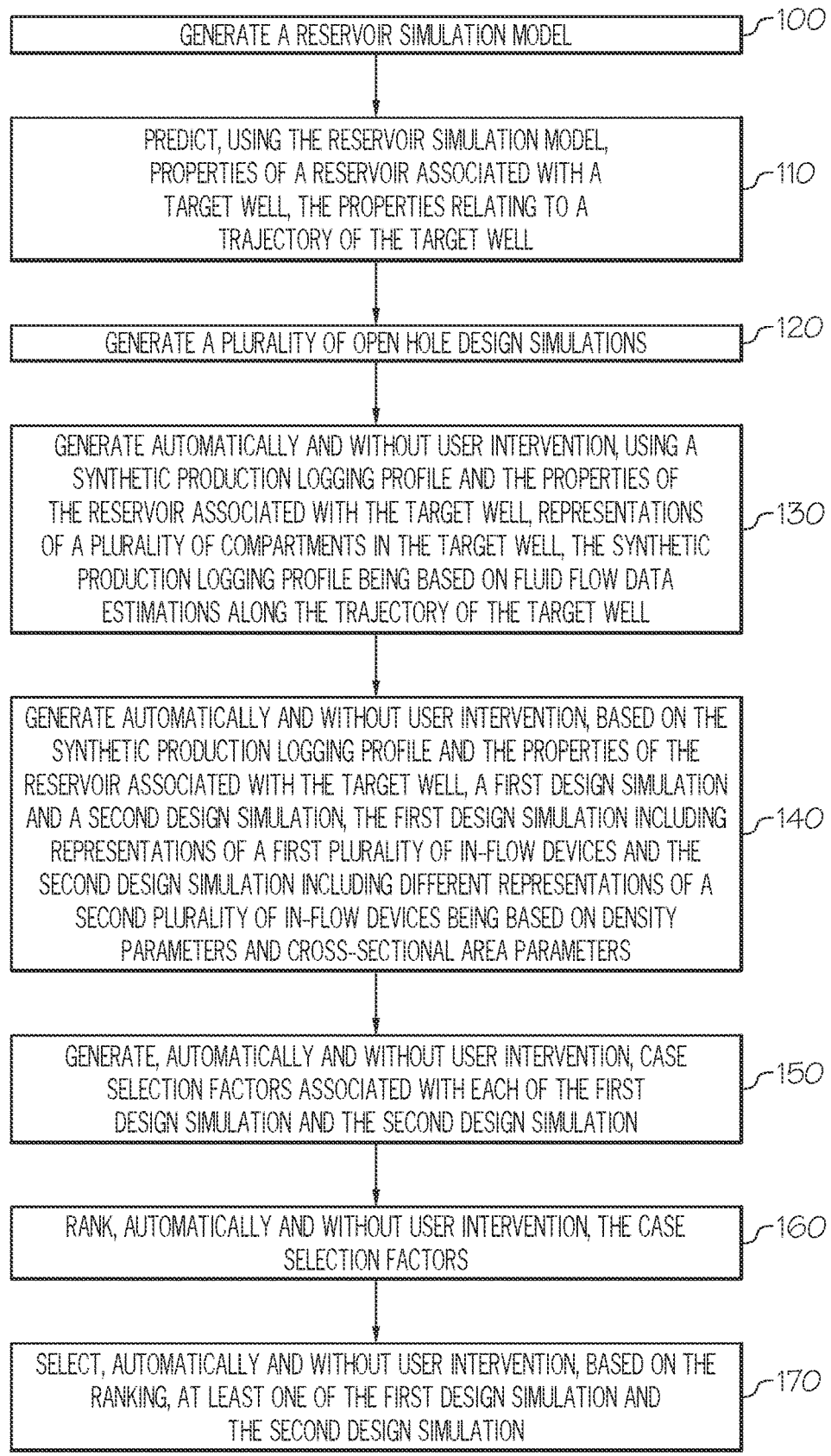
FIG. 1 depicts a flowchart of an example method for generating in-flow control device design simulations and selecting one or more of these design simulations based on case selection factors associated with each design simulation, according to one or more embodiments described and illustrated herein.

A challenge faced by oil and gas companies today is the need to generate simulations that aid in identifying locations of in-flow control devices (hereinafter referred to as in-flow devices or in-flow control devices, ICDs) within compartments of casings that are installed in wells. While some conventional tools and techniques use software based analytical tools and techniques to design ICD completion simulations (e.g., configurations of one or more locations of ICDs in wells), these tools fail to adequately analyze the properties of reservoirs in which one or more wells may be installed, thereby limiting the accuracy of these simulations.

The embodiments described in the present disclosure address and overcome these deficiencies. Specifically, the methods and systems described herein, implemented via one or more computing devices, are configured to produce a plurality of in-flow control device design simulations based on a reservoir simulation model that is generated based on various reservoir properties, reservoir models, geo-steering data, etc. Additionally, the systems and methods described herein enable the updating of in-flow control device design simulations in real time. In particular, the in-flow control device design simulations may be updated, modified, revised, and so forth, after a wellbore associated with a target well has been drilled to a particular target depth. Subsequent to completion of the wellbore, any changes in reservoir properties or detection of new reservoir properties may be incorporated into a reservoir simulation model in real time. In this way, the reservoir simulation model may be updated.

Thereafter, based on the updated reservoir simulation model, multiple in-flow device design simulations may be generated in real time. Specifically, the in-flow control device design simulations that are generated prior to the drilling of the wellbore associated with the target well may be revised such that locations of one or more ICDs included therein are changed. Alternatively or additionally, entirely new in-flow device design simulations may be generated based on the real time updating of the reservoir simulation model (e.g., which incorporates changes in porosity and permeability values along the drilled wellbore, any changes in the trajectory, and other such data). Additionally, various calculations may be performed (e.g. case selection or design simulation selection factors), and one or more in-flow control design simulations (from the newly generated or modified simulations) may be selected, automatically and without user intervention, based on the case selection factor calculations. In this way, in-flow control device design simulations may be generated in an efficient and automated manner to aid in improving production activities, e.g., improving the extraction of hydrocarbons from one or more wells in a reservoir.

The methods and systems of the present disclosure are depicted, in part in FIGS. 2-8, each of which will be described in detail in the present disclosure. It is noted that one or more of FIGS. 2-8 may be referenced interchangeably during a description of one or more of FIGS. 2-8.

FIG. 1 depicts a flowchart of an example method for generating in-flow control device design simulations and selecting one or more of these design simulations based on case selection factors associated with each design simulation, according to one or more embodiments described herein. These steps are detailed below.

In embodiments, in step 100, as part of generating in-flow control device design simulations, the computing device 104 may generate a reservoir simulation model associated with a reservoir in which a target well is to be installed. This simulation model may be generated based on data collected regarding various reservoir properties, e.g., porosity, permeability, water saturation, and so forth. A reservoir may be a subsurface body of rock having one or more porosity and permeability values associated therewith. Depending on the composition of the reservoir, the porosity and/or permeability values may be largely uniform throughout the reservoir or vary significantly from one portion of the reservoir to another (e.g., the properties may vary every five meters, and so forth). In embodiments, the reservoir simulation model may be generated based on historical data related to a plurality of reservoirs in which one or more wells are installed. Alternatively or additionally, the reservoir simulation model may be based on a combination of historical data related to a plurality of reservoirs and data that is collected in real time with respect to one or more reservoirs in which a well has been recently installed. It is noted that the reservoir simulation model may be updated in real time upon incorporation of new data related to various reservoir properties, e.g., porosity values, permeability values, water saturation values, and so forth.

In step 110, in embodiments, the reservoir simulation model may be used to predict properties along a well trajectory of a target well, e.g., a well that may be installed at some point in the near future. The trajectory of the well may be primarily vertical in nature, primarily horizontal, or may have a combination of horizontal, vertical, diagonal, or curved configurations. In embodiments, it is noted that the composition and other properties of the reservoirs determines, in part the shape, dimensions, and curvature of the reservoir. For example, if the reservoir has rock properties that are homogenous throughout the rock, the target well trajectory may be primarily horizontal or primarily vertical, and so forth. Alternatively, if the rock properties of the rock are heterogeneous throughout the rock, a combination of horizontal, vertical, diagonal, or curved well configurations may be utilized associated with the target well trajectory.

Figure 2:
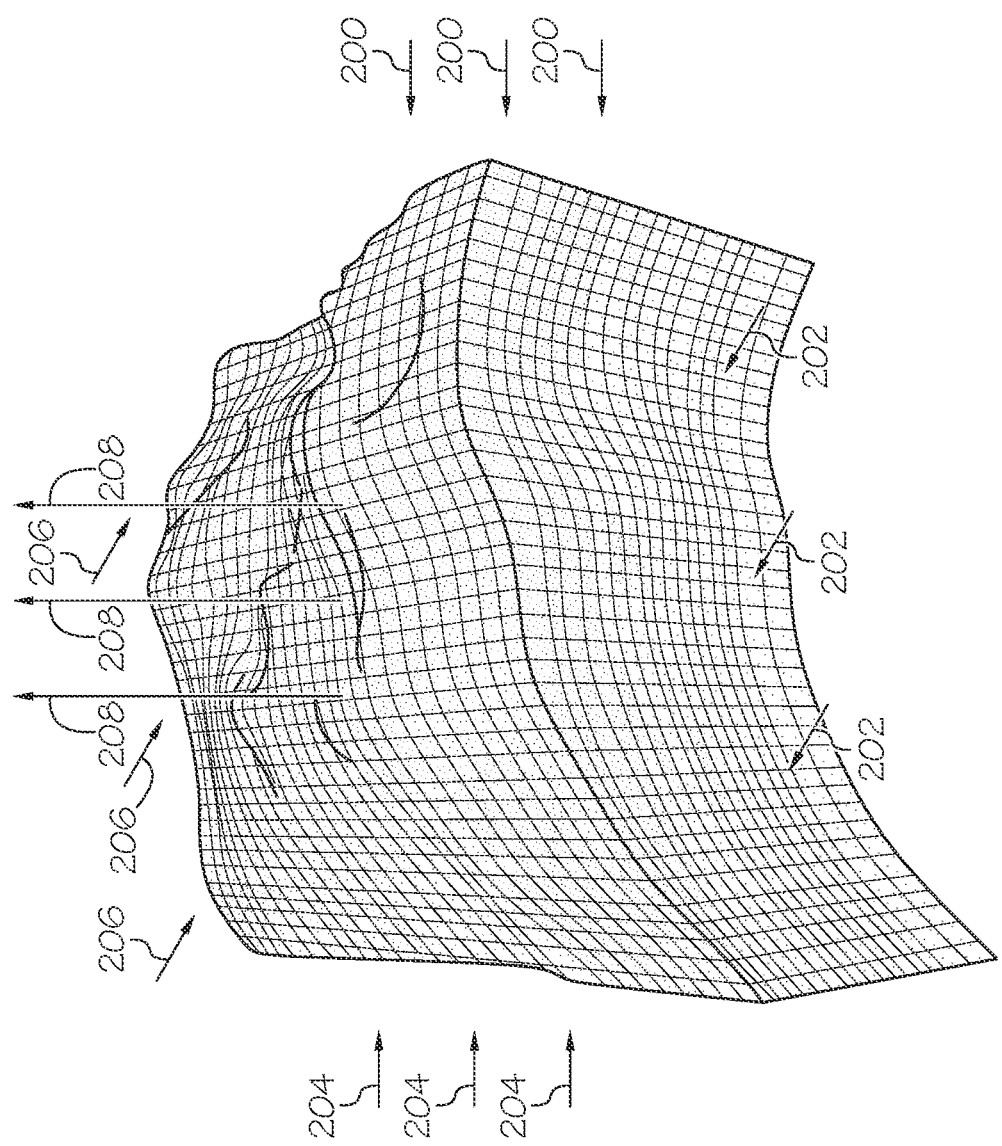
FIG. 2 depicts an example illustration of a reservoir simulation model, according to one or more embodiments described and illustrated herein.
Figure 3:
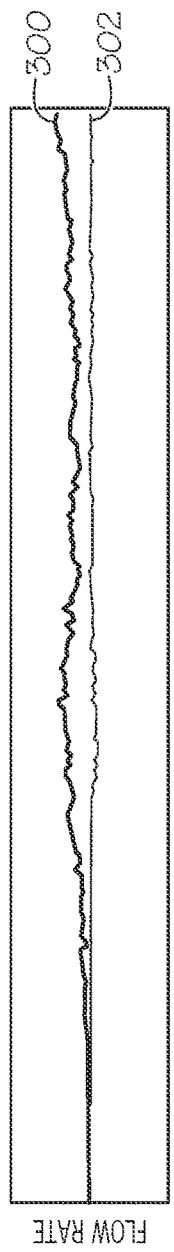
FIGS. 3, 3A, 3B, and 3C illustrate flow rates associated with flux conditions of a reservoir over a certain period of time, according to one or more embodiments described and illustrated herein.
Figure 3A:
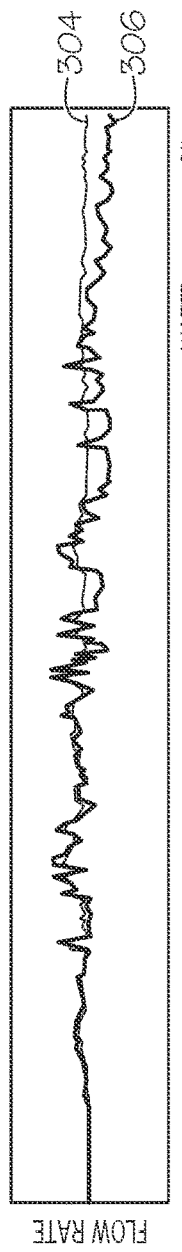
Figure 3B:
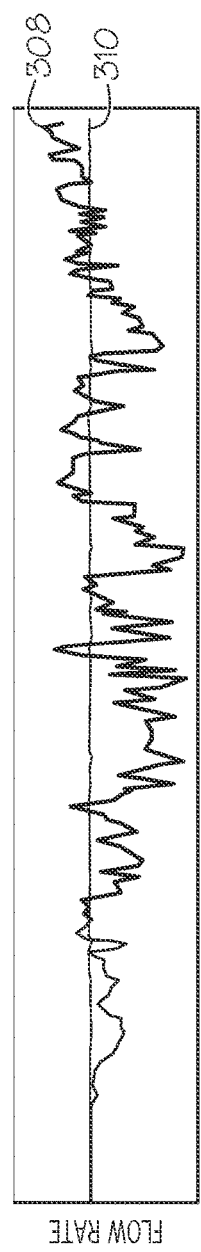
Figure 3C:
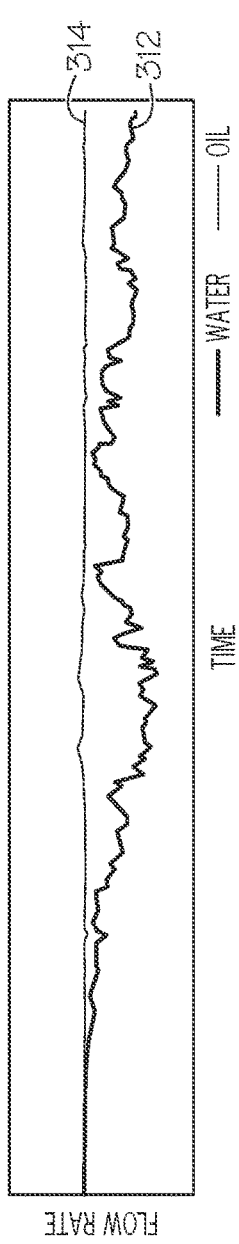

FIG. 2 depicts an example illustration of a reservoir simulation model, according to one or more embodiments described herein. In particular, in embodiments, the reservoir simulation model may be based on an analysis of an area around a particular radius of a location at which a target well is to be drilled. From this, an analysis of the flux conditions in and around portions of the area in which the target well is to be drilled may be performed, and these flux conditions may be indicated by, e.g., arrows 200, 202, 204, and 206. Specifically, these arrows may indicate flux conditions from the northern, southern, eastern, and western boundaries. In contrast, the arrows 208 that point upwards from the reservoir are indicative of production voidage. Boundary flux conditions and production voidage are utilized to determine predicted fluid flow rates, e.g., oil flow rates and water flow rates.

FIGS. 3, 3A, 3B, and 3C illustrate flow rates associated with flux conditions of a reservoir over a certain period of time, according to one or more embodiments described herein. In particular, water flow rates associated with the boundary fluxes from the northern, western, eastern, and southern boundaries are indicated by graph representations 300 in FIG. 3, 304 in FIG. 3A, 308 in FIG. 3B, and 312 in FIG. 3C, and the oil flow rates are indicated by graph representations 302 in FIG. 3, 306 in FIG. 3A, 310 in FIG. 3B, and 314 in FIG. 3C. It is noted that these are exemplary graphical representations and that the flow rates may vary significantly depending on the composition of the reservoirs. Thereafter, the computing device 104 may generate a synthetic production logging profile or simulation that is based on fluid flow data estimations along a trajectory of a target well. In particular, in embodiments, such a simulation may be based on data relating to oil flow values (e.g., oil flow rates), water flow values (e.g., water flow rates), overall quantities of oil, water, other fluids in a reservoir, and so forth. The synthetic production logging profile may be generated using historical data related to one or more reservoirs including wells that were previously operational, are currently operational, and so forth. In short, the synthetic production logging simulation may be utilized to make predictions of various oil flow values, water flow and saturation values, and other metrics that are indications of the likely productivity levels associated with a target well that could be installed in a reservoir.

Thereafter, as described in step 120, the computing device 104 may generate a plurality of open-hole design simulations. The open-hole design simulations (e.g., virtual depictions and calculations) may be associated with well bores at multiple depth levels within the reservoir. Open-hole design (e.g., barefoot design) is a simple and cost effective type of design process. In this process, a hole or aperture (wellbore) may be drilled from the surface to a certain depth, and a production casing may be installed such that the casing may be installed to a depth level that is just above the bottommost portion of the reservoir. Moreover, the bottom portion of the casing may not be sealed (e.g., may be uncapped). As such, during hydrocarbon extraction, the hydrocarbons may flood into the wellbore through this unsealed portion. Additionally, depending on the type of fluids present in the reservoir near the unsealed bottom portion, sand, water, natural gas, and other reservoir fluids may enter the wellbore in an unfiltered manner. Moreover, the areas of the reservoir surrounding the wellbore near the unsealed bottom portion may cave in and collapse into the wellbore, requiring costly and time consuming repair. However, if the composition of the reservoir is well known, and the likelihood of fluids other than hydrocarbon gas liquids (HGL) is low, open-hole designs may be valuable. It is noted that, a casing may be pipe that is composed of steel or other such material.

In the embodiments described herein, the open-hole design simulations generated by the computing device 104 may serve as a benchmark of potential productivity levels of a target well. As part of the open-hole design simulations, productivity estimations (e.g., associated with various depth levels) may be generated for a certain period of time, e.g., 20 years. These estimations may include oil flow estimates, water breakthrough estimates, locations of water breakthrough estimates, and so forth, from the time when a particular well becomes operational to the time when most of all of the fluids (e.g., hydrocarbon gas liquids (HGL)) are depleted. In embodiments, the productivity estimates included as part of the open-hole design simulations may serve as benchmarks or potential productivity levels that an engineer, designer, or machine will attempt to meet or exceed via the installation of, e.g., in-flow control devices in select locations along the casing installed in the wellbore. Contrary to open-hole designs, cased hole designs may involve, e.g., steel pipes that are installed in a wellbore in a reservoir with the bottom portion of the steel pipes being sealed. Compartments may be installed at various locations along the casing (e.g., steel pipes) and multiple in-flow control devices may be installed within each of these compartments. Contrary to open-hole designs, the installation of in-flow control devices will facilitate effective filtering and management of the extraction of fluids from the reservoir such that some of the disadvantages of the open-hole designs are overcome.

Referring to FIG. 1, in step 130, the computing device 104 may generate automatically and without user intervention, using a synthetic logging profile and properties of a reservoir associated with a target well, representations of a plurality of compartments in the target well. The synthetic production logging profile may be based on fluid flow data estimations along the trajectory of the target well. The representations of these compartments may be virtual two-dimensional or three-dimensional representations.

Figure 4:
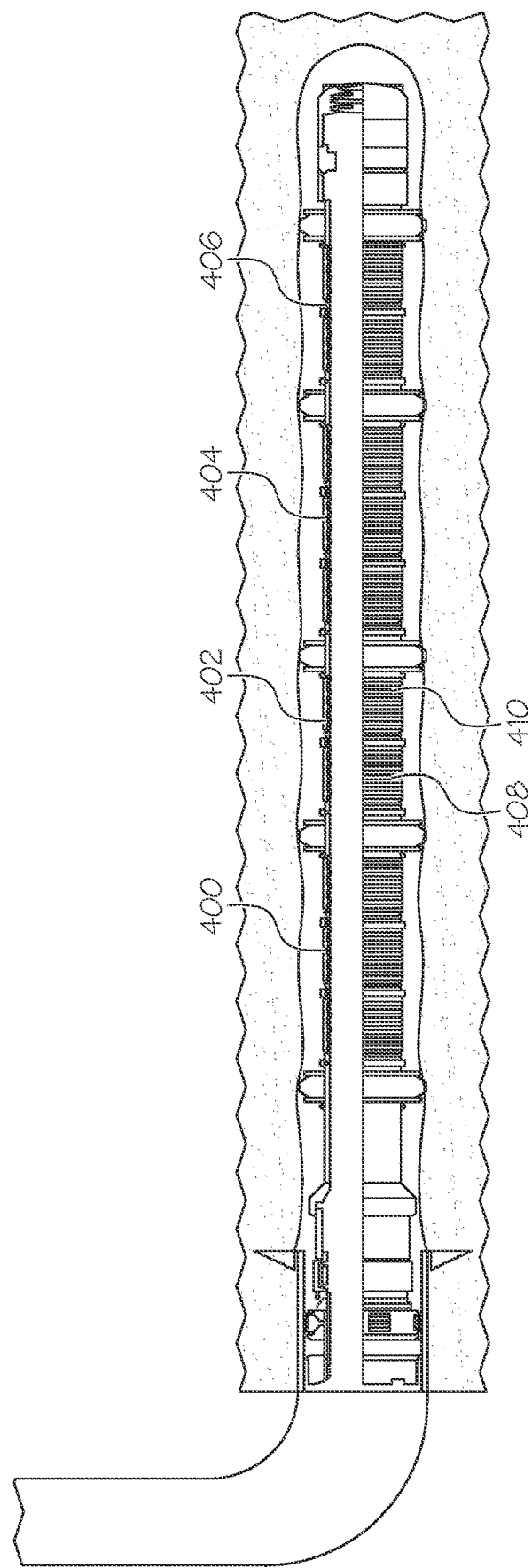
FIG. 4 illustrates representations of a plurality of compartments that may be installed at select locations along a trajectory of a target well, according to one or more embodiments described and illustrated herein.

FIG. 4 illustrates representations of a plurality of compartments that may be installed at select locations along a trajectory of a target well, according to one or more embodiments described herein. Specifically, in FIG. 4, a portion of a target well having a substantially horizontal well section is depicted to include four compartments 400, 402, 404, and 406. Each of these compartments is shown to include multiple in-flow control devices, e.g., two in some instances, three in other instances, and so forth. In one example, in-flow control devices 408 and 410 are shown to be installed within compartment 402. The manner in which a number of in-flow devices are to be included in a compartment, dimensions of the in-flow devices, and other properties of these in-flow devices are determined will be described in further detail later on in this disclosure.

Next, referring to step 140 depicted in the flow chart in FIG. 1, the computing device may generate, automatically and without user intervention, a first design simulation that includes representations of a plurality of in-flow devices within the representations of the plurality of compartments. In embodiments, the locations of the representations of the first plurality of in-flow devices are based on calculations of density parameters and cross-sectional area parameters. Additionally, in embodiments, as stated in step 130 of the flow chart in FIG. 1, a second design simulation that includes representations of a second plurality of in-flow devices within the representations of the plurality of compartments may be generated, automatically and without user intervention, by the computing device 104. In embodiments, the locations of the representations of the second plurality of in-flow devices are based on a different set of density parameters and a different set of cross-section area parameters. It is noted that the cross-sectional area parameter referenced above relates to a nozzle setting and a quantity of nozzles included in each in-flow control device.

The computing device 104 may generate various design simulations using the algorithms described below. In particular, in embodiments, the computing device 104 may generate the first design simulation and the second design simulation based on various factors and considerations. For example, these factors may include a number of ICD devices that are to be included in a compartment, nozzle settings associated with each ICD device, and so forth. These factors or metrics may be determined by the computing device 104 using certain algorithms. In particular, a parameter representing the density of ICD joints within a compartment—$J_{DEN}$ parameter—may be determined by the computing device 104 using the following algorithm:

$$S_{ICD} = \left\lfloor \frac{L-J}{J_{DEN}*J} \right\rfloor + 1 \quad (1)$$

In the above algorithm, the term "L" represents the length of the compartment, the term "J" represents a length of an ICD device, the term "$J_{DEN}$" represents a joint density parameter, and the term "$S_{ICD}$" represents the number of in-flow control devices for a given value of "$J_{DEN}$". Moreover, it is noted that the algorithm (1) includes "[ ]", which is a symbol representing a whole number result of the operation performed within the brackets. Additionally, the computing device 104 may determine nozzle settings for the plurality of ICD devices using the following algorithm:

$$X_{AREA} = n * \frac{\pi D^2}{4} \quad (2)$$

In the above algorithm, the term "$X_{AREA}$" represents an in-flow control device cross sectional flow area, the term "n" represents the number of nozzles in in-flow control devices, and the term "D" represents ICD nozzle diameter. Using algorithms (1) and (2) above, the computing device 104 may, automatically and without user intervention, perform a sampling operation of a plurality of parameter calculations of $S_{ICD}$ and $X_{AREA}$, and utilize the samples to generate a number of in-flow control device design simulations. In embodiments, each simulation may include a particular number of in-flow control devices placed within select compartments of the plurality of compartments described above. For example, if the representations of compartments, as described in FIG. 4, include 50 compartments, a particular simulation may include three in-flow control devices placed within each of the 50 compartments, with varying nozzle settings for a variety of these devices. Alternatively, in another simulation, only a partial number of the 50 compartments may have in-flow control devices included therein. In this way, the computing device 104 may generate a plurality of in-control device design simulations, e.g., 100 different simulations.

Figure 5:
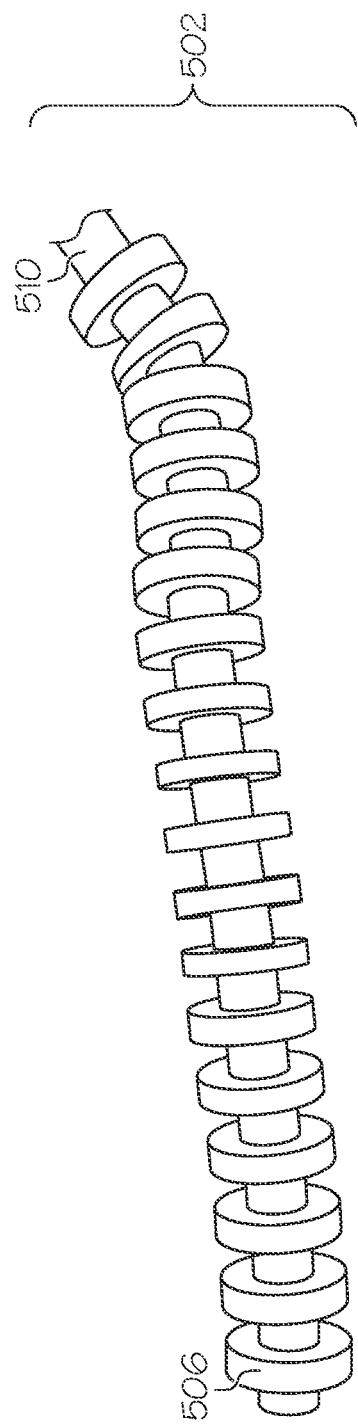
FIGS. 5 and 5A illustrate two exemplary in-flow control device design simulations, according to one or more embodiments described and illustrated herein.
Figure 5A:
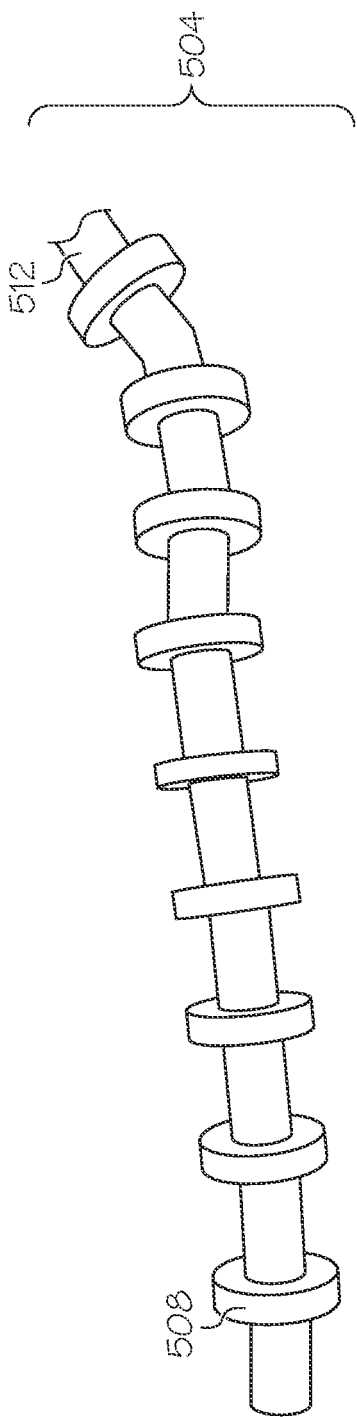

FIGS. 5 and 5A illustrate two exemplary in-flow control device design simulations, according to one or more embodiments described herein. In particular, FIG. 5 depicts simulation 502 and FIG. 5A depicts simulation 504. Each of the simulations 502, 504 have varying configurations. Simulation 502 of FIG. 5 includes in-flow control devices 506 that are tightly packed or placed on target well 510 (e.g., a representation of a virtual well based on a closed hole casing) such that the distance between an in-flow control device and a neighboring in-flow control device is small. In contrast, simulation 504 of FIG. 5A depicts in-flow control devices 508 placed on target well 512 (e.g., a representation of a different virtual well based on a closed hole casing) that are less tightly packed relative to simulation 502. It is noted that the number of nozzle settings for each of the in-flow control devices 506 and 508 may vary. It is further noted that a plurality of other in-flow control device design simulations may be generated, automatically and without user intervention.

Thereafter, in embodiments, the target well may be physically drilled to a specific depth within the reservoir. During and subsequent to the drilling process, various reservoir properties may be better determined and analyzed. For example, during and after the drilling of the well, porosity values, permeability values, water saturation measurement, and so forth of the reservoir in which the target well is drilled may be determined (e.g., captured using a plurality of sensors, flow meters, and so forth), in real time. These values may be then be incorporated into the reservoir simulation model (described above) in real time such that the robustness of the data upon which the reservoir simulation model is built is improved. For example, in embodiments, the trajectory and orientation of the target well after it has been drilled, the structure and dimensions of the well, the stratigraphy of the reservoir in which the target well is drilled, and any changed porosity and permeability values of the reservoir in the areas surrounding the well (and elsewhere) may be incorporated into the reservoir simulation model. In this way, the reservoir simulation model may be updated in real time by the computing device 104.

The computing device 104 may then update the previously generated in-flow control device design simulations. Alternatively or additionally, the computing device 104 may generate entirely new in-flow control device design simulations based on the drilling of the target well and the updated reservoir simulation model.

Figure 6:
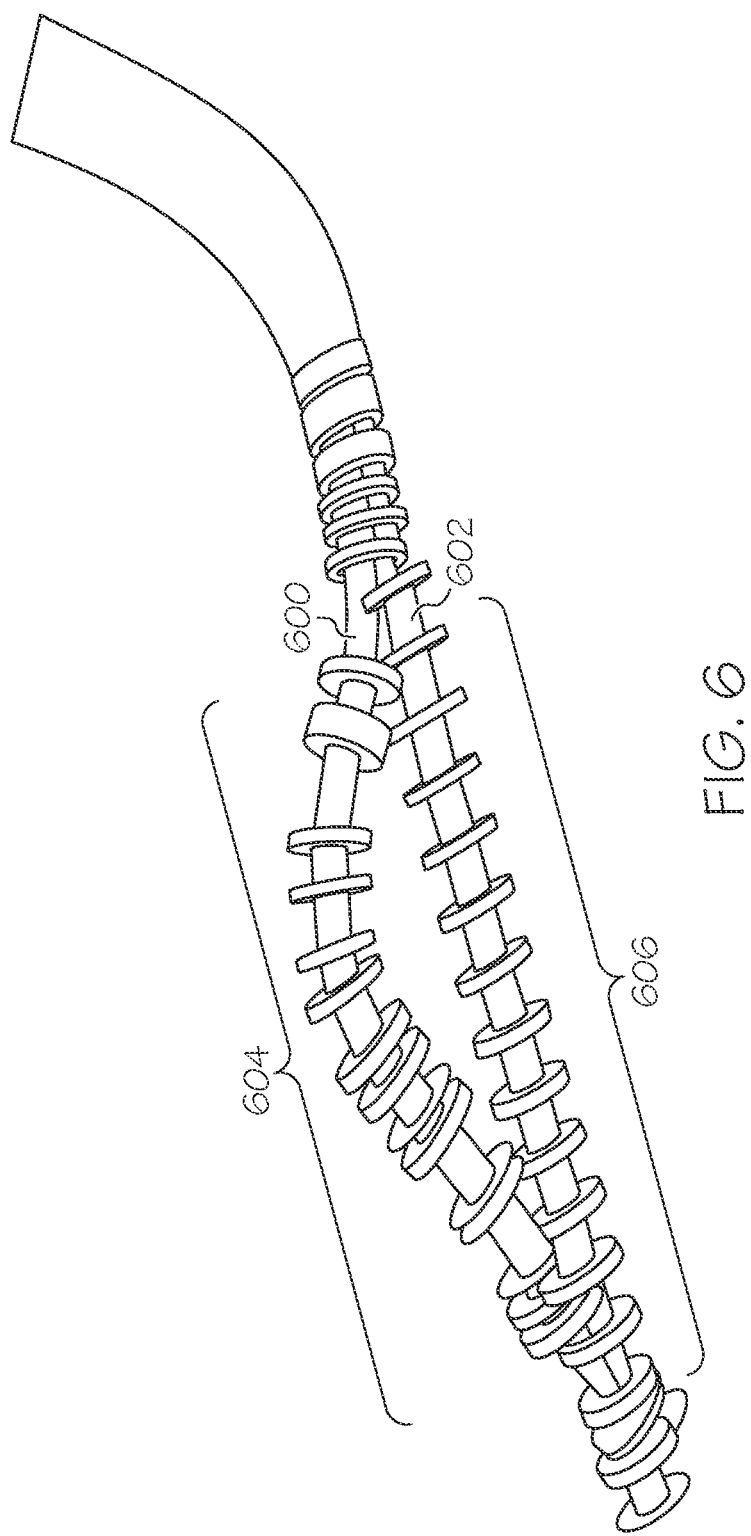
FIG. 6 illustrates differences between an in-flow control device design simulation of a target well prior to the well being drilled and a different in-flow control device design simulation of the target well after the well is drilled, according to one or more embodiments described and illustrated herein.

FIG. 6 illustrates differences between an in-flow control device design simulation of a target well prior to the well being drilled and a different in-flow control device design simulation of the target well after the well is drilled, according to one or more embodiments described herein. In particular, in FIG. 6, an exemplary drilled target well may include a casing 600 that is depicted as including a curved configuration and having a plurality of in-flow control devices 604 placed at various locations along the casing 600. In contrast, a simulated target well may include a different casing 602 that includes a plurality of in-flow control devices 606, which appears to be placed at consistent intervals along a horizontal portion of this casing of the simulated target well. It is noted that, after drilling of the target well, the placement of the in-flow control devices may be indicated as part of one of a plurality of in-flow control device simulations, namely simulations that are generated based on an updated reservoir simulation model that includes a plurality of reservoir properties, or more accurately determined reservoir properties as a result of drilling of the target well. The in-flow control device design simulation that is depicted in FIG. 6 may be generated by the computing device 104 based on the selection of one of the plurality of in-flow control device simulations in accordance with certain steps.

Figure 7:
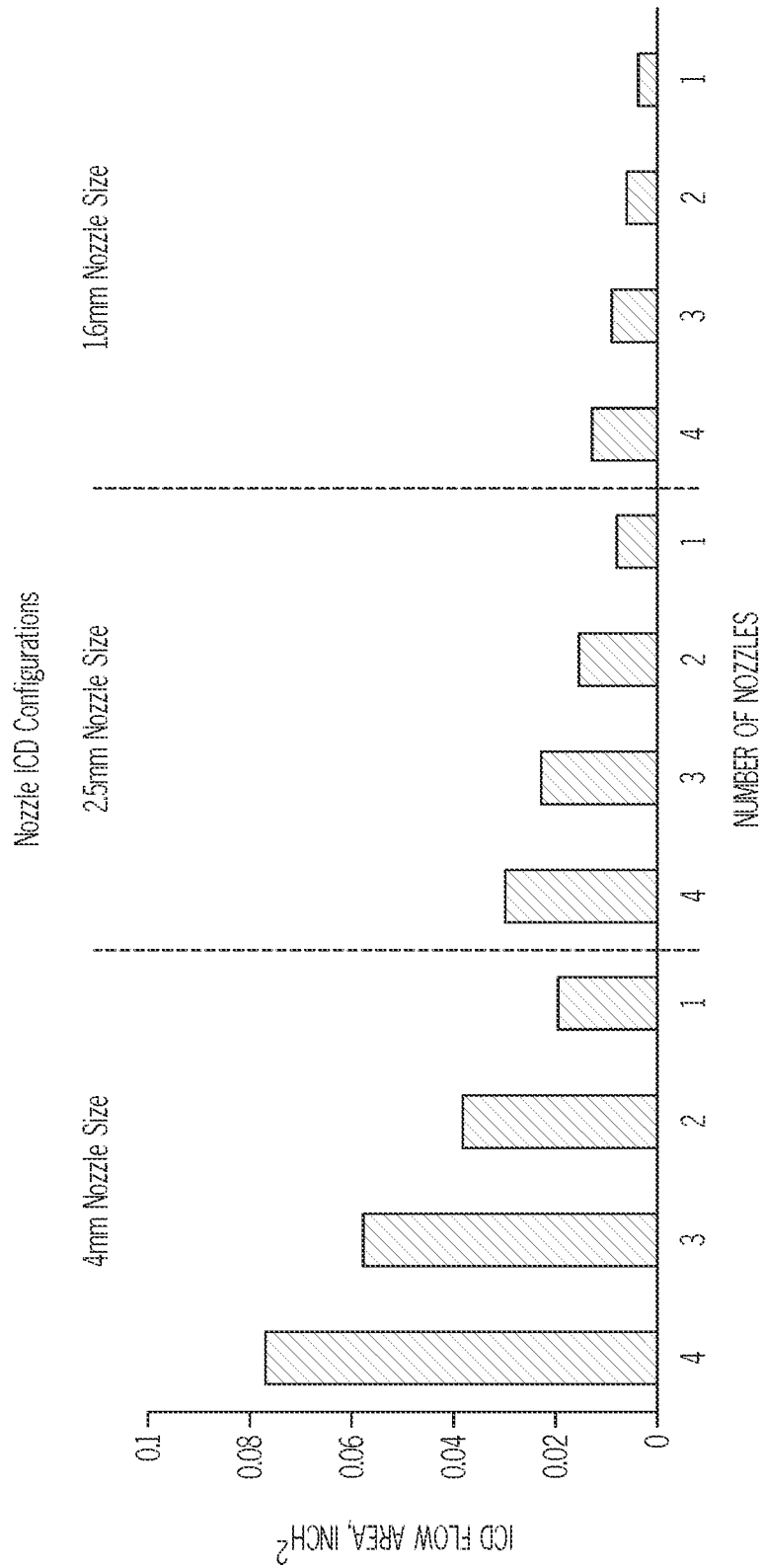
FIG. 7 depicts a number of nozzle characteristics of a plurality of in-flow control devices included in the simulations, according to one or more embodiments described and illustrated herein.

FIG. 7 depicts a number nozzle characteristics of a plurality of in-flow control devices included in the simulations, according to one or more embodiments described herein. In particular, FIG. 7 depicts flow characteristics associated with a plurality of nozzles having different nozzle diameters. As depicted, an in-flow control device having a nozzle diameter of 4 millimeters has a larger flow capacity relative to an in-flow control device having a nozzle diameter of 2.5 millimeters and 1.6 millimeters, respectively. As such, as depicted, a number of in-flow control devices (e.g., 4, 3, 2, and 1) having a nozzle diameter of 4 millimeters will have a total volume of liquids flowing through these devices that is larger than, e.g., the equivalent number of in-flow control devices (e.g., 4, 3, 2, and 1) having a nozzle diameter of 2.5 millimeters and 1.6 millimeters.

As previously stated, after a target well has been drilled (e.g., based on a reservoir simulation model that is updated in real time), a plurality of in-flow control device design simulations may be newly generated or previously generated simulations may be modified (e.g., based on the updated reservoir simulation model). Thereafter, just as in the open hole design simulations, productivity estimations (e.g., associated with various depth levels) may be generated for a certain period of time (e.g., 20 years) for each one of the generated simulations. For example, cumulative oil and cumulative water production estimates may be generated for each simulation using the following algorithms:

$$C_o(t) = \int_0^{t_n} q_o(t)dt \quad (3)$$

$$C_w(t) = \int_0^{t_n} q_w(t)dt \quad (4)$$

In the above algorithms, the term "$q_o(t)$" represents an oil flow rate as a function of time, the term "$q_w(t)$" represents a water flow rate as a function of time, the term "$C_o(t)$" represents a cumulative oil quantity as a function of time, "$C_w(t)$" represents a cumulative water quantity as a function of time, and $t_n$ represents a time a time associated with an end of a simulation.

Thereafter, as stated in step 150 of the flow chart illustrated in FIG. 1, the computing device 104 may generate, automatically and without user intervention, case selection factors associated with each of the in-flow control device design simulations (e.g., the first design simulation and the second design simulation). Specifically, the computing device 104 may generate case selection factors by determining, for each of the generated plurality of in-flow control device design simulations, a case selection factor using the following algorithm:

$$F = \omega_1 * \frac{C_o(t_n)}{(C_o(t_n) + C_w(t_n))} + \omega_2 * \frac{(N_{ICDmax} - N_{ICD})}{N_{ICDmax}} + \omega_3 * \frac{PI_{OH}}{PI_{ICD}} \quad (5)$$

In the above algorithm (5), the term "F" represents the case selection factor, the term $N_{ICDmax}$ represents the maximum number of in-flow control devices that can be physically installed in the horizontal section of a target well. In other words, $N_{ICDmax}$ represents the maximum number generated by algorithm (1). The term $N_{ICD}$ represents the total number of in-flow control devices generated in a design simulation, the term $PI_{OH}$ represents the predicted productivity index from the open-hole design simulation, the term $PI_{ICD}$ represents the predicted productivity index from in-flow control device design simulation, and the terms $\omega_1$, $\omega_2$, $\omega_3$ represent the weight fractions for oil recovery, the number of in-flow control devices, and the productivity index calculations as part of the case selection factor calculation respectively.

As described above, the algorithm (5) is a function of potential oil recovery from a well, the total number of in-flow control devices per simulation, and a well productivity index. Using algorithm (5), numerous case selection factors may be determined. Thereafter, as stated in step 160 of the flowchart depicted in FIG. 1, the computing device 104 may rank, automatically and without user intervention, the case selection factors. In embodiments, the ranking may be based on an amount of oil that may potentially be recovered using a specific number of in-flow control devices included in a particular in-flow control device design simulation. Specifically, the simulations may be ranked such that a simulation having the maximum amount of predicted oil recovery (relative to all of the other generated in-flow control device design simulations), using the least or minimal total number of in-flow control devices (relative to all of the other generated in flow control device design simulations), with the least predicted drop in productivity index (relative to all of the other generated in-flow control device design simulations) will be ranked highest, while a different simulation having the lowest amount of predicted oil recovery (relative to all of the other generated in-flow control device design simulations), using the largest total number of in-flow control devices (relative to all of the other generated in-flow control device design simulations), with the most predicted drop in productivity index (relative to all of the other generated in-flow control device design simulations) will be ranked lowest.

It is noted that, in embodiments, the first design simulation and the second design simulation (described above) may be included in the ranking according to the above criteria. Thereafter, as stated in step 170 of the flow chart illustrated in FIG. 1, the computing device 104 may select based on the ranking, automatically and without user intervention, at least one of the first design simulation or the second design simulation. Alternatively, in other embodiments, a plurality of other simulations in addition to the first design simulation and the second design simulation may be selected, e.g., if multiple simulations have substantially similar or identical case selection factor values. A variety of other embodiments are also contemplated. For example, in embodiments, the computing device 104 may select a first design simulation if the case selection factor of the first design simulation has a value that is higher than a different value of the different case selection factor. Alternatively, the computing device 104 may select the second design simulation if the value of the case selection factor of the first design simulation is lower than the different value of the different case selection factor. Other such embodiments are also contemplated.

Figure 8:
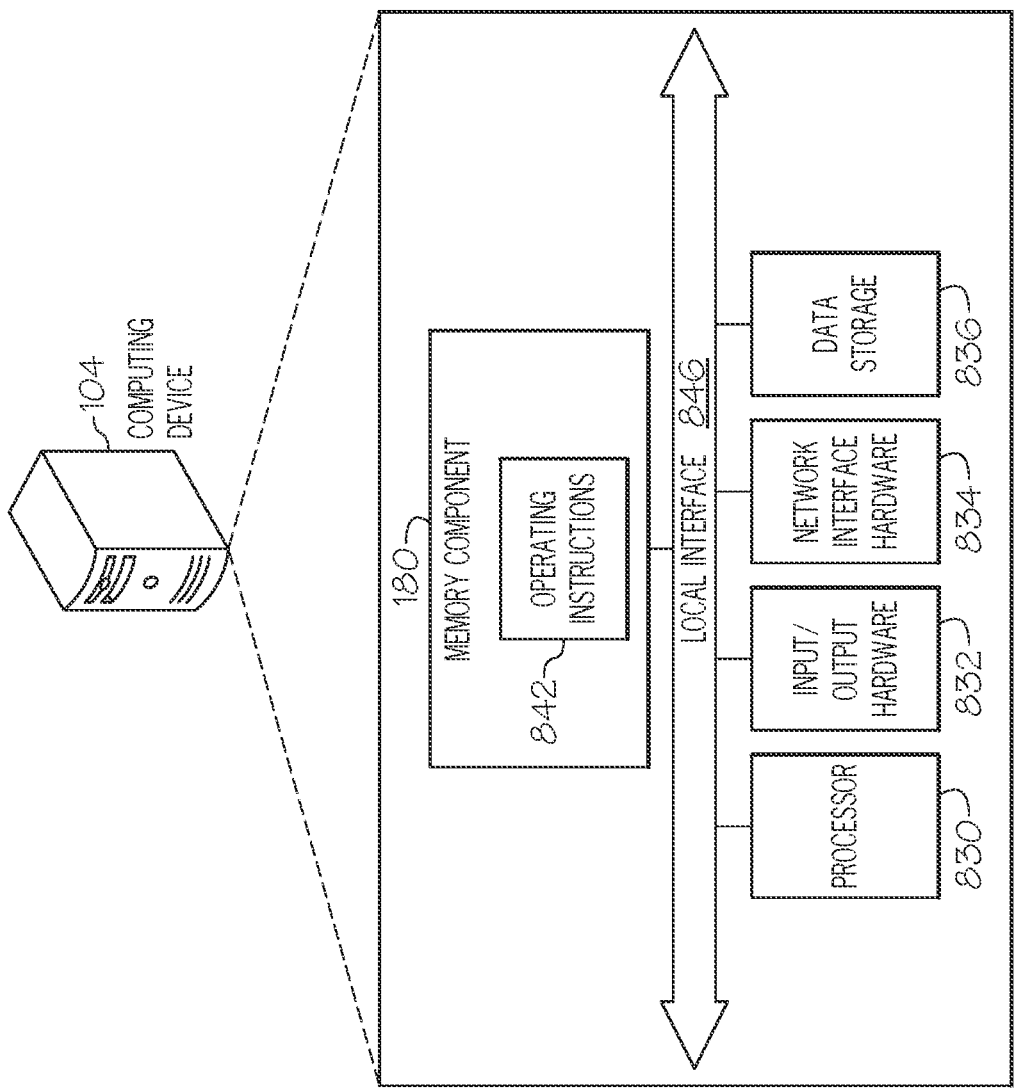
FIG. 8 depicts a non-limiting example of a computing device 104 configured to determine the heterogeneity indices, according to one or more embodiments described and illustrated herein.

FIG. 8 depicts a non-limiting example of a computing device 104 configured to generate in-flow control device design simulations, according to one or more embodiments described herein. As illustrated, the computing device 104 includes a processor 830, input/output hardware 832, a network interface hardware 834, a data storage 836, and a memory component 180. The memory component 180 may be configured as volatile and/or nonvolatile memory and as such, may include random access memory (including SRAM, DRAM, and/or other types of RAM), flash memory, secure digital (SD) memory, registers, compact discs (CD), digital versatile discs (DVD) (whether local or cloud-based), and/or other types of non-transitory computer-readable medium. Depending on the particular embodiment, these non-transitory computer-readable mediums may reside within the computing device 104 and/or external to the computing device 104. It is noted that the memory component includes various types of data that may be accessed and temporarily stored therein, e.g., production logging data, reservoir properties data (e.g., porosity data, permeability data, water saturation data, and so forth), data related to the in-flow control device design simulations such as the number of compartments included in a well, the numbers of in-flow devices included in each compartment, the quantity of nozzles installed or present in each in-flow device, case selection factors associated with each simulation, and so forth. The memory component 180 may store operating instructions 842, each of which may be embodied as a computer program, firmware, and so forth. A local interface 846 is also included in FIG. 8 and may be implemented as a bus or other communication interface to facilitate communication among the components of the computing device 104.

The processor 830 may include any processing component operable to receive and execute operating instructions 842 (such as from a data storage component 836 and/or the memory component 180). As described above, the input/output hardware 832 may include and/or be configured to interface with speakers, microphones, and/or other input/output components.

The operating instructions 842 may include an operating system and/or other software for managing components of the computing device 104. It should be understood that while the components in FIG. 8 are illustrated as residing within the computing device 104, this is merely an example. In some embodiments, one or more of the components may reside external to the computing device 104 or within other devices. It should also be understood that, while the computing device 104 is illustrated as a single device, this is also merely an example.

As an example, one or more of the functionalities and/or components described herein may be provided by the computing device 104. Depending on the particular embodiment, any of these devices may have similar components as those depicted in FIG. 8. To this end, any of these devices may include instructions for performing the functionality described herein.

It should now be understood that certain embodiments described herein are directed to a method for generating in-flow control device design simulations and selecting at least one simulation from the generated simulations based on a case selection factor value of this simulation relative to the other simulations. The method includes generating, using a synthetic production logging profile and properties of a reservoir associated with a target well, representations of a plurality of compartments in the target well, the synthetic production logging profile is based on fluid flow data estimations along a trajectory of the target well, generating, automatically and without user intervention, a first design simulation, the first design simulation including representations of a first plurality of in-flow devices within the representations of the plurality of compartments, locations of the representations of the first plurality of in-flow devices are based on density parameters and cross-sectional area parameters, and generating, automatically and without user intervention, a second design simulation, the second design simulation including representations of a second plurality of in-flow devices within the representations of the plurality of compartments, locations of the representations of the second plurality of in-flow devices are based on different density parameters and different cross-section area parameters. The method further includes generating, automatically and without user intervention, case selection factors associated with each of the locations of the representations of the first plurality of in-flow devices and the locations of the representations of the second plurality of in-flow devices, ranking, automatically and without user intervention, the case selection factors, and selecting based on the ranking, automatically and without user intervention, at least one of the first design simulation or the second design simulation.

The terminology used herein is for the purpose of describing particular aspects only and is not intended to be limiting. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof. The term "or a combination thereof" means a combination including at least one of the foregoing elements.

It is noted that the terms "substantially" and "about" may be utilized herein to represent the inherent degree of uncertainty that may be attributed to any quantitative comparison, value, measurement, or other representation. These terms are also utilized herein to represent the degree by which a quantitative representation may vary from a stated reference without resulting in a change in the basic function of the subject matter at issue.

While particular embodiments have been illustrated and described herein, it should be understood that various other changes and modifications may be made without departing from the spirit and scope of the claimed subject matter. Moreover, although various aspects of the claimed subject matter have been described herein, such aspects need not be utilized in combination. It is therefore intended that the appended claims cover all such changes and modifications that are within the scope of the claimed subject matter.

What is claimed is:

1. A method implemented using a computing device, the method comprising:
   generating, based on a synthetic production logging profile and properties of a reservoir associated with a target well, a first design simulation and a second design simulation, wherein:
   the first design simulation includes representations of a first plurality of in-flow devices,
   the second design simulation includes different representations of a second plurality of in-flow devices, and
   locations of the representations of the first plurality of in-flow devices and different locations of the different representations of the second plurality of in-flow devices are based on density parameters and cross-sectional area parameters, wherein:
   the density parameters relate to numbers of in-flow devices within each compartment of the plurality of compartments and the cross-sectional area parameters relate to a nozzle setting and a quantity of nozzles of each in-flow control device of the first plurality of in-flow devices and the second plurality of in-flow devices; and the numbers of in-flow devices within each compartment are determined based on solving a following algorithm:

$$S_{ICD} = \left\lfloor \frac{L-J}{J_{DEN}*J} \right\rfloor + 1.$$

where:

"L" is a length of the compartment, "J" is a length of an individual in-flow control device, "$J_{DEN}$" is a joint density parameter, and "$S_{ICD}$" is a number of in-flow control devices for a given value of $J_{DEN}$;

generating, automatically and without user intervention, case selection factors associated with each of the first design simulation and the second design simulation;

ranking, automatically and without user intervention, the case selection factors; and selecting based on the ranking, automatically and without user intervention, at least one of the first design simulation or the second design simulation.

2. The method of claim 1, further comprising:
generating a reservoir simulation model; and
predicting, using the reservoir simulation model, the properties of the reservoir associated with the target well, wherein the properties relate to a trajectory of the target well.

3. The method of claim 2, further comprising generating, using the synthetic production logging profile and the properties of the reservoir associated with the target well, additional representations of a plurality of compartments in the target well, wherein the synthetic production logging profile is based on fluid flow data estimations along the trajectory of the target well.

4. The method of claim 3, wherein the additional representations of the plurality of compartments are two-dimensional or three-dimensional.

5. The method of claim 1, wherein the properties of the reservoir include one or more of porosity, permeability, and water saturation.

6. The method of claim 1, wherein the representations of the first plurality of in-flow devices and the different representations of the second plurality of in-flow devices are two-dimensional or three-dimensional.

7. The method of claim 1, wherein the selecting at least one of the first design simulation or the second design simulation is based on a comparison of a case selection factor of the first design simulation and a different case selection factor of the second design simulation.

8. The method of claim 7, wherein the selecting at least one of the first design simulation or the second design simulation includes:

selecting the first design simulation if the case selection factor of the first design simulation has a value that is higher than a different value of the different case selection factor; and selecting the second design simulation if the value of the case selection factor of the first design simulation is lower than the different value of the different case selection factor.

9. A system comprising:
one or more processors; and
one or more non-transitory memory modules communicatively coupled to the one or more processors and storing machine-readable instructions that, when executed, cause the one or more processors to:

generate, based on a synthetic production logging profile and properties of a reservoir associated with a target well, a first design simulation and a second design simulation, wherein:
the first design simulation includes representations of a first plurality of in-flow devices,
the second design simulation includes different representations of a second plurality of in-flow devices, and
locations of the representations of the first plurality of in-flow devices and different locations of the different representations of the second plurality of in-flow devices are based on density parameters and cross-sectional area parameters;

generate, automatically and without user intervention, case selection factors associated with each of the first design simulation and the second design simulation, wherein:
the density parameters relate to numbers of in-flow devices within each compartment of the plurality of compartments and the cross-sectional area parameters relate to a nozzle setting and a quantity of nozzles of each in-flow control device of the first plurality of in-flow devices and the second plurality of in-flow devices; and
the numbers of in-flow devices within each compartment are determined based on solving a following algorithm:

$$S_{ICD} = \left\lfloor \frac{L-J}{J_{DEN}*J} \right\rfloor + 1,$$

where:

"L" is a length of the compartment, "J" is a length of an individual in-flow control device, "$J_{DEN}$" is a joint density parameter, and "$S_{ICD}$" is a number of in-flow control devices for a given value of $J_{DEN}$;

rank, automatically and without user intervention, the case selection factors; and select, based on the ranking, automatically and without user intervention, at least one of the first design simulation or the second design simulation.

10. The system of claim 9, wherein the machine-readable instructions, when executed, further cause the one or more processors to:

generate a reservoir simulation model; and
predict, using the reservoir simulation model, the properties of the reservoir associated with the target well, wherein the properties relate to a trajectory of the target well.

11. The system of claim 10, wherein the machine-readable instructions, when executed further cause the one or more processors to generate, using the synthetic production logging profile and the properties of the reservoir associated with the target well, additional representations of a plurality of compartments in the target well, wherein the synthetic production logging profile is based on fluid flow data estimations along the trajectory of the target well.

12. The system of claim 11, wherein the additional representations of the plurality of compartments are two-dimensional or three-dimensional.

13. The system of claim 12, wherein the density parameters relate to numbers of in-flow devices within each compartment of the plurality of compartments and the cross-sectional area parameters relate to a nozzle setting and a quantity of nozzles of each in-flow control device of the first plurality of in-flow devices and the second plurality of in-flow devices.

14. The system of claim 9, wherein the machine-readable instructions, when executed, further cause the one or more processors to select at least one of the first design simulation or the second design simulation based on a comparison of a case selection factor of the first design simulation and a different case selection factor of the second design simulation.

15. The system of claim 14, the machine-readable instructions, when executed, further cause the one or more processors to select at least one of the first design simulation or the second design simulation by:
  selecting the first design simulation if the case selection factor of the first design simulation has a value that is higher than a different value of the different case selection factor; and
  selecting the second design simulation if the value of the case selection factor of the first design simulation is lower than the different value of the different case selection factor.

16. A method implemented using a computing device, the method comprising:
  generating a reservoir simulation model;
  predicting, using the reservoir simulation model, properties of a reservoir associated with a target well, the properties relating to a trajectory of the target well;
  generating, using a synthetic production logging profile and the properties of the reservoir associated with the target well, representations of a plurality of compartments in the target well, the synthetic production logging profile is based on fluid flow data estimations along the trajectory of the target well;
  generating, based on the synthetic production logging profile and the properties of the reservoir associated with the target well, a first design simulation and a second design simulation, wherein:
    the first design simulation includes representations of a first plurality of in-flow devices,
    the second design simulation includes representations of a second plurality of in-flow devices, and
    locations of the representations of the first plurality of in-flow devices and different locations of the representations of the second plurality of in-flow devices are based on density parameters and cross-sectional area parameters, wherein:
      the density parameters relate to numbers of in-flow devices within each compartment of the plurality of compartments and the cross-sectional area parameters relate to a nozzle setting and a quantity of nozzles of each in-flow control device of the first plurality of in-flow devices and the second plurality of in-flow devices; and
      the numbers of in-flow devices within each compartment are determined based on solving a following algorithm:

$$S_{ICD} = \left\lfloor \frac{L-J}{J_{DEN} * J} \right\rfloor + 1,$$

where:
    "L" is a length of the compartment, "J" is a length of an individual in-flow control device, "$J_{DEN}$" is a joint density parameter, and "$S_{ICD}$" is a number of in-flow control devices for a given value of $J_{DEN}$;
  generating, automatically and without user intervention, case selection factors associated with each of the first design simulation and the second design simulation;
  ranking, automatically and without user intervention, the case selection factors; and
  selecting based on the ranking, automatically and without user intervention, at least one of the first design simulation or the second design simulation.

17. The method of claim 16, wherein the representations of the first plurality of in-flow devices and the representations of the second plurality of in-flow devices are two-dimensional or three-dimensional.

* * * * *